(12) United States Patent
Steinmuller-Nethl et al.

(10) Patent No.: US 11,746,415 B2
(45) Date of Patent: Sep. 5, 2023

(54) METHOD FOR APPLYING A CARBON LAYER TO A SUBSTRATE COMPRISING INTRODUCING A PROCESS GAS INTO A DEPOSITION CHAMBER VIA A GAS INLET AND GAS ACTIVATION ELEMENT

(71) Applicant: CARBONCOMPETENCE GMBH, Wattens (AT)

(72) Inventors: Doris Steinmuller-Nethl, Aldrans (AT); Detlef Steinmuller, Aldrans (AT)

(73) Assignee: CARBONCOMPETENCE GMBH, Wattens (AT)

( * ) Notice: Subject to any disclaimer, the term of this patent is extended or adjusted under 35 U.S.C. 154(b) by 358 days.

(21) Appl. No.: 16/872,394

(22) Filed: May 12, 2020

(65) Prior Publication Data

US 2020/0270765 A1    Aug. 27, 2020

Related U.S. Application Data

(62) Division of application No. 16/337,944, filed as application No. PCT/AT2017/060248 on Oct. 4, 2017, now abandoned.

(30) Foreign Application Priority Data

Oct. 4, 2016  (AT) .............................. A 50894/2016

(51) Int. Cl.
  *C30B 25/10*  (2006.01)
  *C23C 16/455*  (2006.01)
  (Continued)

(52) U.S. Cl.
  CPC ........ *C23C 16/45502* (2013.01); *C23C 16/27* (2013.01); *C23C 16/448* (2013.01);
  (Continued)

(58) Field of Classification Search
  CPC ......... C30B 25/00; C30B 25/02; C30B 25/10; C30B 25/14; C30B 25/16; C30B 25/165;
  (Continued)

(56) References Cited

U.S. PATENT DOCUMENTS 4,208,373 A   6/1980  Matovich
5,068,871 A * 11/1991  Uchida ................. C23C 16/271
                                                  118/724
(Continued)

FOREIGN PATENT DOCUMENTS

CN     1123847 A    6/1996
CN     1261927 A    8/2000
(Continued)

OTHER PUBLICATIONS

Office Action received in corresponding Austrian Patent Application No. A 50894/2016 dated Jul. 7, 2017 (6 pages).
(Continued)

*Primary Examiner* — Kenneth A Bratland, Jr.
(74) *Attorney, Agent, or Firm* — Kilyk & Bowersox, P.L.L.C.

(57) ABSTRACT

The invention relates to a device (1) and method for applying a carbon layer, in particular a diamond layer, to a substrate (2, 2*a*) by means of chemical vapour deposition, comprising a deposition chamber (3) into which a process gas, in particular molecular hydrogen and/or a mixture of molecular hydrogen and a carbon-containing gas, such as methane can be supplied, wherein a gas inlet and gas activation element (7) is provided in the form of a hollow body with a flow channel (7*b*) for the process gas, a wall (7*a*) surrounding the flow channel (7*b*), and an outlet opening (16) feeding from the flow channel (7*b*) into the deposition chamber (3), and a heating device (8) is provided for heating the wall (7*a*) of the gas inlet and gas activation element (7).

18 Claims, 3 Drawing Sheets

(51) Int. Cl.
*C23C 16/27* (2006.01)
*C30B 25/16* (2006.01)
*C30B 29/04* (2006.01)
*C23C 16/448* (2006.01)
*C30B 25/14* (2006.01)

(52) U.S. Cl.
CPC ...... *C23C 16/4488* (2013.01); *C23C 16/4557* (2013.01); *C23C 16/45578* (2013.01); *C30B 25/10* (2013.01); *C30B 25/14* (2013.01); *C30B 25/165* (2013.01); *C30B 29/04* (2013.01)

(58) Field of Classification Search
CPC ......... C30B 29/00; C30B 29/02; C30B 29/04; C23C 16/27; C23C 16/448; C23C 16/4488; C23C 16/45502; C23C 16/4557; C23C 16/45578
USPC ................... 117/84, 88, 102, 104, 928–929
See application file for complete search history.

(56) References Cited

U.S. PATENT DOCUMENTS

| | | | |
|---|---|---|---|
| 5,479,874 | A | 1/1996 | Correa |
| 5,552,220 | A * | 9/1996 | Goujard ................ C04B 35/83 427/419.7 |
| 5,560,779 | A | 10/1996 | Knowles et al. |
| 6,200,652 | B1 | 3/2001 | Sun et al. |
| 8,048,483 | B2 | 11/2011 | Yoon et al. |
| 2004/0221809 | A1 | 11/2004 | Ohmi et al. |
| 2006/0254516 | A1 | 11/2006 | Karasawa et al. |
| 2007/0026144 | A1 | 2/2007 | Park et al. |
| 2009/0011602 | A1 | 1/2009 | Nozawa et al. |
| 2015/0315707 | A1 | 11/2015 | Xue et al. |
| 2017/0241049 | A1 | 8/2017 | Zeng et al. |

FOREIGN PATENT DOCUMENTS

| | | | | |
|---|---|---|---|---|
| CN | 1332268 | A | | 1/2002 |
| CN | 1419268 | A | | 5/2003 |
| CN | 1807681 | A | | 7/2006 |
| CN | 1827846 | A | | 9/2006 |
| CN | 1842894 | A | | 10/2006 |
| CN | 101330044 | A | | 12/2008 |
| CN | 101390199 | A | | 3/2009 |
| CN | 101448971 | A | | 6/2009 |
| JP | S58-91100 | A | | 5/1983 |
| JP | 61163195 | A | * | 7/1986 ............ C23C 16/27 |
| JP | S61-163195 | A | | 7/1986 |
| JP | H05-890 | A | | 1/1993 |
| JP | H07118092 | A | | 5/1995 |
| JP | 2009108417 | A | | 5/2009 |
| KR | 20080075330 | A | | 8/2008 |
| WO | 9506143 | A1 | | 3/1995 |

OTHER PUBLICATIONS

International Search Report and Written Opinion issued in corresponding International Patent Application No. PCT/AT2017/060248 (with English translation of International Search Report) dated Dec. 4, 2017 (16 pages).

International Preliminary Report on Patentability issued in corresponding International Patent Application No. PCT/AT2017/060248 dated Jan. 3, 2019 (12 pages).

International Preliminary Report on Patentability (English translation) issued in corresponding International Patent Application No. PCT/AT2017/060248 dated Jan. 3, 2019 (6 pages).

Office Action received in corresponding Korean Patent Application No. 10-2019-7008684 dated Aug. 6, 2019 with English translation (10 pages).

Office Action received in corresponding Japanese Patent Application No. 2019-515582 dated Oct. 1, 2019 with English translation (7 pages).

Office Action received in corresponding Chinese Patent Application No. 201780061468.3 dated Nov. 6, 2019 (9 pages).

* cited by examiner

METHOD FOR APPLYING A CARBON LAYER TO A SUBSTRATE COMPRISING INTRODUCING A PROCESS GAS INTO A DEPOSITION CHAMBER VIA A GAS INLET AND GAS ACTIVATION ELEMENT

This application is a divisional of U.S. patent application Ser. No. 16/337,944, filed Mar. 29, 2019, which is a National Stage Application of PCT/AT2017/060248, filed Oct. 4, 2017, which in turn claims priority to Austrian Patent Application No. A 50894/2016, filed Oct. 4, 2016.

The invention relates to a device according to the preamble of claim 1.

The invention also relates to a method according to the preamble of claim 13.

Document DE 689 09 491 T2 discloses a device for applying diamond layers by chemical vapour deposition, which device has a cylindrical reaction chamber which is closed off at opposite ends by plates. Four molybdenum rods extend through the upper plate into the interior of the reaction chamber, wherein the free ends are arranged at a distance from the lower plate. An open quartz tube is located around two rods and is arranged axially in the cylinder. A gas inlet opening in the upper plate is connected to the tube, whereas a further gas inlet opening is connected to the volume of the cylinder not occupied by the tube. An electrical resistance heater in the form of a heating coil (filament) is arranged between each two of the molybdenum rods and brings the various process gases by means of thermal excitation to the temperature required for the diamond deposition. The rods are connected to a power source via separate control devices. A driveshaft protrudes through the base plate and is connected to a turntable. The substrate to be coated is arranged on the turntable. By rotating the turntable the substrate is thus arranged alternately beneath one of the two gas inlet openings and is thus on the one hand brought into contact with carbon-containing gases, whereby a diamond layer is deposited, and on the other hand brought into contact with carbon-free gases, whereby non-diamond-like carbon-depositions are removed. This "hot-filament" method has become established, in addition to a microwave-supported method.

Document JP H05890 A describes a CVD (chemical vapour deposition) plant which uses heatable capillaries attached to a chamber in order to heat hydrogen. The capillaries are open at one end, such that no pressure can build up during the heating. Thus, there is no impact excitation.

Document U.S. Pat. No. 5,479,874 A also discloses a CVD plant which preheats a process gas by means of a pre-heater before said process gas is brought by means of heating wires to the final operating temperature. In this prior art as well there is no impact excitation.

A disadvantage of what is known as the hot-filament method for diamond deposition is that the excitation rate of the thermal excitation of the process gases with the heating coil is rather low, and it is not possible to exert a local, controlled influence on the excitation of the individual gas types. In addition, a deposition of diamond on the substrate frequently can be ensured only at a distance from a few millimetres to a few centimetres from the filaments. Due to the low active growth species the growth rate is relatively low. On the whole, the known method is not only time-consuming and costly, but also can be controlled only with difficulty.

The object of the present invention is therefore to overcome or at least mitigate at least individual disadvantages of the prior art. The invention therefore in particular aims to create a device and a method with which the excitation rate of the process gas, in particular hydrogen, is improved, a homogeneous deposition of the carbon layer on the substrate is made possible, and preferably improved control of the coating process is made possible, in particular for large coating areas and substrates of complex forms.

This object is achieved by a device having the features of claim 1, the use of a gas inlet and gas activation element according to claim 11, and by a method having the features of claim 12. Preferred embodiments are described in the dependent claims.

In accordance with the invention a gas inlet and gas activation element is provided in the form of a hollow body with a flow channel for the process gas, a wall surrounding the flow channel and an outlet opening feeding (leading) from the flow channel into the deposition chamber, and a heating device is provided for heating the wall of the gas inlet and gas activation element. The heating device is designed to excite the process gas flowing in the flow channel of the gas inlet and gas activation element by impact excitation and thermal excitation.

In a preferred application a diamond layer is deposited on a substrate, for example a hard metal tool, a silicon wafer, a titanium implant, a gemstone, a sensor/CMOS component, etc. In this embodiment the deposition is performed by exciting a carbon-containing gas, in particular methane, but also ethylene, acetylene, etc. The carbon atoms can be excited as a result of the excitation, and thus form chemical radicals (for example methyl radicals), which then lead to diamond growth (sp3-hybridised carbon) on the specially prepared substrate. Besides diamond, other carbon modifications can also be formed, for example graphite (sp2-hybridised carbon) or polymers (sp-hybridised carbon). In order to prevent or remove undesirable carbon modifications, atomic hydrogen is required for etching of the undesirable species. In order to realise this, molecular hydrogen gas in this embodiment is dissociated by the gas inlet and gas activation element, such that the outflowing, excited atomic hydrogen "etches away" the undesirable carbon modifications, such as graphite, polymers, etc., and therefore promotes the formation of a pure diamond structure. Furthermore, the atomic hydrogen heats the parts to be coated by recombination and is therefore a key energy carrier. In addition, further chemical and catalytic processes take place by collisions of the atomic hydrogen with the carbon-containing gas. The efficacy of the excitation is thus increased. A maximum excitation rate of hydrogen is thus of particular significance. The diamond deposition is performed in a deposition chamber, in which preferably a negative pressure, in a particular embodiment in the mbar range, prevails. The process gases are preferably methane and hydrogen. The hydrogen and the carbon-containing process gas are preferably introduced separately into the deposition chamber. In so doing, the process gases are activated in order to achieve the subsequent deposition of a diamond layer on the substrate. Alternatively, the process gases can be introduced into the deposition chamber jointly, in particular in the form of a mixture of methane and hydrogen, via the gas inlet and gas activation element. In order to promote the formation of a diamond layer on the surface of the substrate, this reaction is performed preferably under reduced pressure. In the hot-filament method of the prior art, the process gases are excited exclusively by thermal excitation via a heated wire. It is disadvantageous that excitation rates of atomic hydrogen for example of merely 20% can be achieved as a result. This is associated in particular with the fact that the excitation in the hot-filament method is performed only thermally and in the immediate vicinity of the heating wire. In the device according to the invention, by contrast, the wall of the gas inlet and gas activation element is heated preferably over its entire length. For this purpose, the wall of the gas inlet and gas activation element is connected to a heating device which causes the wall of the gas inlet and gas activation element to be directly heated. The process gas therefore advantageously can be excited not only thermally, but by a combination of thermal excitation and impact excitation. Excitation rates of atomic hydrogen of more than 80% can thus be achieved. This allows an acceleration of the growth of diamond layers with high purity and a more energy-efficient deposition with high growth rates. Furthermore, a higher growth rate of the diamond layer as compared to the prior art is achieved by the method.

In accordance with a particularly preferred embodiment termination bodies at (longitudinal-side) ends of the gas inlet and gas activation element are attached in order to close off the flow channel. The termination bodies may be formed in one or more parts with the heatable wall of the gas inlet and gas activation element. The gas inlet and gas activation element is preferably formed closed, apart from an inlet opening, through which the process gas, in particular hydrogen, is guided into the flow channel of the gas inlet and gas activation element, and apart from the outlet opening(s). As a result of the termination bodies, there may be a rise in the partial pressure within the gas inlet and gas activation element, whereby impact excitation is also provided advantageously in addition to thermal excitation. In addition, the average free path length of the activated particles may rise to a number of centimetres, whereby the distance from the substrate can be increased, which in turn results in a more uniform carbon layer.

Preferably the gas inlet and gas activation element comprises an inner diameter of from 0.1 mm to 15 mm with a circular cross-section. The pressure is thus significantly reduced, and the collision excitations with the wall are increased.

For the purposes of this disclosure the location and directional specifications, such as "top", "bottom", etc., relate to the intended operating state of the device when a diamond layer is deposited on the substrate.

In a preferred embodiment the heating device is designed to heat the wall of the gas inlet element to a temperature of more than 2000° C., in particular more than 2200° C., preferably more than 2400° C. The process gas is thus brought to the required excitation temperature so that the process gas, in particular hydrogen gas, is activated for the deposition process.

For efficient etching of graphite and other undesirable carbon modifications, high amounts of atomic hydrogen, which can be attained with the aid of the gas inlet and gas activation element, are advantageous in a preferred application. Furthermore, the crystallite size can be kept low by the relatively large amount of atomic hydrogen (specifically by increasing secondary nucleation), and high-grade pure diamond crystals in the nanometre range can be deposited.

In a preferred embodiment the heating device comprises a power supply, connected to the wall of the gas inlet and gas activation element, for a resistance heating of the gas inlet and gas activation element. In this embodiment the heating process can be controlled quickly and precisely. Furthermore this variant is of simple design and is economical. The resistance heating, as has long been known in the prior art, comprises a power supply or power source by means of which an electric current is guided through the wall of the gas inlet and gas activation element. Here, the electrical energy of the electrical current is converted into thermal energy. A resistance heating of this kind can be arranged on the outer side of the deposition chamber. The resistance heating can also be arranged at a distance from the deposition chamber by means of a cable connection and optionally a vacuum feedthrough.

In a particularly preferred embodiment the gas inlet and gas activation element is arranged substantially horizontally in the deposition chamber. As a result of this arrangement a uniform distance between the gas inlet and gas activation element and the substrate to be coated can be ensured. The deposition of a diamond layer which comprises a uniform thickness over the entire surface of the substrate is thus advantageously preferred. In this way, a high-quality layer can be obtained.

In particular in order to further promote a homogeneous diamond layer with the most uniform layer thickness possible along the substrate surface and in order to thus further increase the quality of the diamond layer, the at least one outlet opening, from which the process gas exits from the gas inlet and gas activation element in the direction of the substrate, is preferably arranged on an underside of the gas inlet and gas activation element which underside faces towards the substrate. In this embodiment the activated process gas, in particular atomic hydrogen, after exiting from the gas inlet and gas activation element flows directly in the direction of the substrate.

In accordance with a preferred embodiment the ratio between the area of precisely one outlet opening and the cross-sectional area of the gas inlet and gas activation element is 1:5 to 1:20, in particular 1:10.

The impact excitation is further intensified by a small cross-section of the gas inlet and gas activation element and the associated increase in the partial pressure in the gas inlet and gas activation element, whereby the excitation rate of the process gas, in particular hydrogen, and the quality of the diamond layer are increased in turn.

In accordance with a particularly preferred embodiment the gas inlet and gas activation element comprises a plurality of outlet openings. The excited process gas (atomic hydrogen) thus flows in a uniform spatial distribution in the direction of the substrate, whereby uniform deposition of the desired sp3-hybridised carbon on the substrate surface can be attained. The formation of a homogeneous, pure diamond layer is thus promoted. These outlet openings can be arranged alternately at an angle to one another, so as to cover a greater volume range for the coating. Furthermore, the process gas can be distributed even more homogeneously between the gas inlet and gas activation element and the substrate if a plurality of small-area outlet openings are present. An optimal geometry and arrangement of the outlet openings can be determined by flow computations. An even more uniform thickness and a high, controlled homogeneity of the diamond layer can thus be achieved.

In accordance with a further preferred embodiment the gas inlet and gas activation element is substantially circular or rectangular in cross-section. This leads to a further increase in the impact excitation of the process gas.

In order to be able to coat substrates of different size and form, a plurality of gas inlet and gas activation elements are preferably provided, which can be heated by means of the heating device. The plurality of gas inlet and gas activation elements can be arranged in the deposition chamber in such a way that a uniform deposition of a diamond layer on the substrate is ensured. For example, a plurality of gas inlet and gas activation elements can be arranged parallel to one another and at the same vertical distance from the substrate. This is advantageous in particular if a substrate with a large horizontal area, for example a plurality of silicon wafers, is to be coated. A homogeneous coating of the entire area, for example of the silicon wafers, advantageously can be made possible. The orientation of the gas inlet and gas activation elements preferably can be adapted to the form of the substrate. The various gas inlet and gas activation elements can also be connected to separate gas feeds, whereby different process gases can be conducted into the deposition chamber via each of the individual gas inlet and gas activation elements. The heating device can be embodied in such a way that the gas inlet and gas activation elements can be heated separately from one another or also together in one or more groups. The form and arrangement of the gas inlet and gas activation elements can be arbitrary and preferably is oriented towards the form of the component to be coated.

In accordance with a further preferred embodiment a further gas inlet element for introducing a further process gas, in particular a carbon-containing gas, preferably methane, into the deposition chamber is provided. The process gases, in particular a carbon-containing gas and hydrogen, therefore can be introduced into the deposition chamber spatially separated from one another and at different times. Amongst other things, the temperature, the rate of introduction into the deposition chamber, and the temporal sequence of the various process gases or concentration thereof can be individually and locally adjusted for each of the carbon-containing process gas and the hydrogen gas. These parameters therefore can be optimised for coating processes having different requirements. The requirements may be for example the thickness of the diamond layer, purity thereof, duration of the coating process, form and material of the substrate, grain size, etc.

In accordance with a further preferred embodiment the wall of the gas inlet and gas activation element consists of a metal, in particular tantalum, molybdenum, tungsten, rhenium, or a ceramic material, or graphite, or pyrolytic carbon or a composite material thereof, or of a preferably fibre-reinforced carbon, in particular with a coating formed from pyrocarbon. Of course, the invention is not to be limited to the aforesaid materials. These materials are characterised by a high melting point, which is necessary in order to be able to withstand the high temperatures of in particular more than 2000° C. required for the excitation. Due to the use of such process-stable and dimensionally stable and temperature-resistant materials, the gas inlet and gas activation element can reliably ensure the excitation of the process gas and the distribution of the excited process gas via the outlet openings to the substrate.

For the homogeneous deposition of a diamond layer with high purity it is expedient to evacuate the deposition chamber before and during the deposition process. For this purpose a vacuum pump is preferably arranged outside the device and generates the negative pressure in the deposition chamber necessary for the deposition process.

The substrate to be coated can be arranged in the interior of the deposition chamber on a substrate holder which is preferably arranged beneath the gas inlet and gas activation element.

In a further embodiment the gas inlet and gas activation element may be arranged in the interior of a hollow substrate that is to be coated.

The substrate holder, depending on the requirements of the substrate, may be connected to a cooling device. This is then expedient if the substrate material for diamond deposition requires a temperature lying for example below 500° C.

In the associated method the wall of the gas inlet and gas activation element is heated in such a way that the process gas flowing in the flow channel of the gas inlet and gas activation element is excited by impact excitation and thermal excitation. For this purpose the wall of the gas inlet and gas activation element can be heated to a temperature of more than 2000° C., in particular more than 2200° C.

In the method, further process gases, such as nitrogen, oxygen, etc., can be used for the acceleration of diamond growth. Furthermore, in order to attain a semiconductor the diamond layer can be doped with elements such as boron, phosphorus, nitrogen or sulphur, etc. These additives can be introduced into the deposition chamber in a gaseous, solid or liquid state.

The invention will be explained in greater detail hereinafter with reference to preferred exemplary embodiments, although the invention is not limited thereto. In the drawing.

Figure 1:
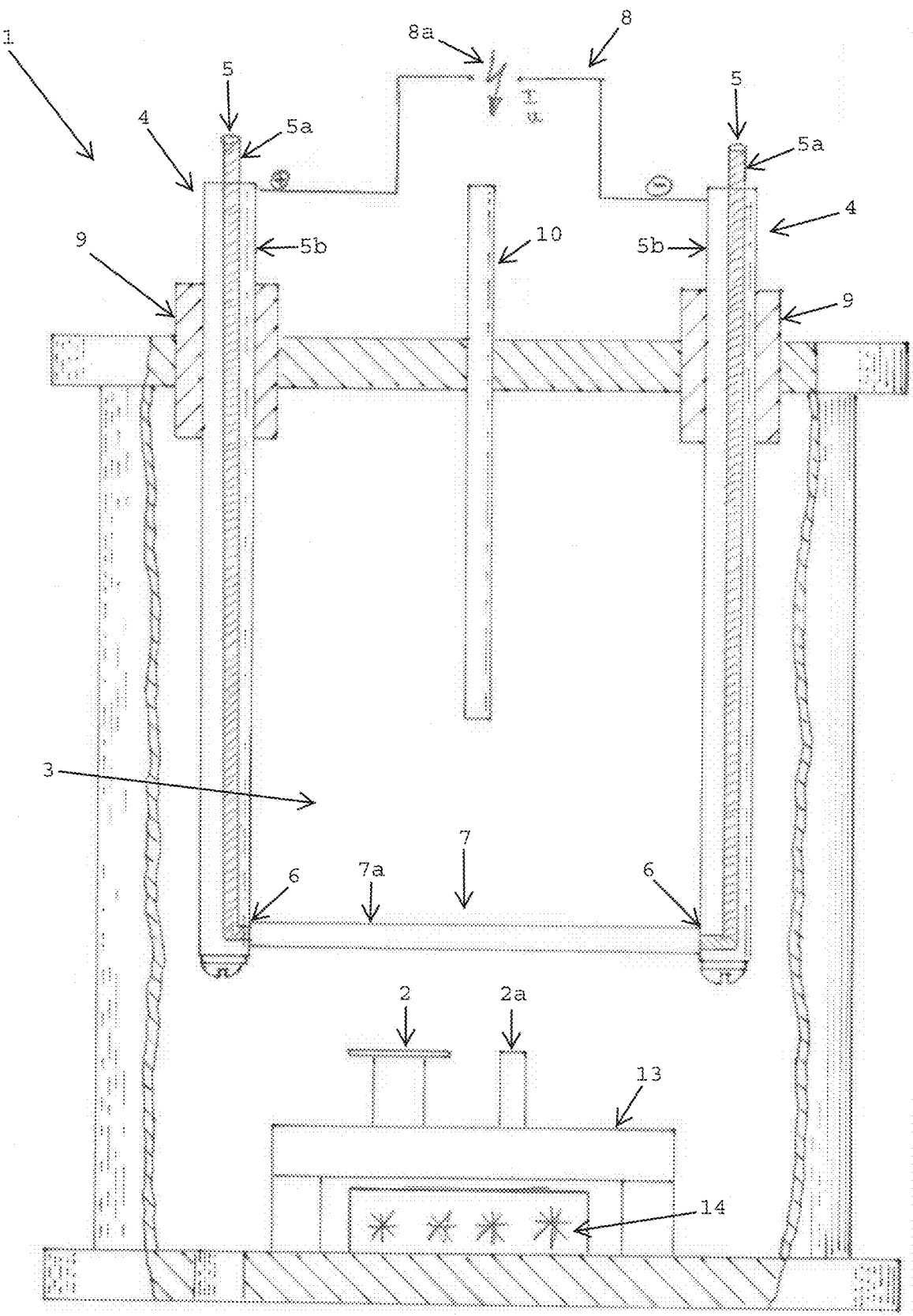
FIG. 1 shows a partial sectional view of a device according to the invention for applying a diamond layer to a substrate by chemical vapour deposition, wherein a process gas is fed into a deposition chamber via a heatable gas inlet and gas activation element.

FIG. 1 shows a device 1 for applying a diamond layer to substrates 2, 2a. Alternatively, a different carbon layer, for example graphene, can be applied to the substrates 2, 2a by means of the device 1. In the shown embodiment the carbon layer is deposited on the one hand on the outer side of the substrate 2 and on the other hand within the substrate 2a. The device 1 comprises a deposition chamber 3 for receiving the substrates 2, 2a. A gas and power feed element 4 is also provided. The gas and power feed element 4 comprises an inner element 5a, in particular made of stainless steel, for feeding a process gas, here molecular hydrogen, and an outer element 5b made of an electrically conductive material, for example copper, for feeding an electrical current. A gas feed opening 5 is formed on the upper side of the inner element 5a, and the process gas is guided via said gas feed opening into the interior of the deposition chamber 3.

As can also be seen from FIG. 1, the gas and power feed element 4 is connected within the deposition chamber 3 via a clamp and screw connection 6 to a gas inlet and gas activation element 7 arranged horizontally in the shown assembly, in such a way that the process gas can be conducted into the gas inlet and gas activation element 7 via the inner element 5a of the gas and power feed element 4. Furthermore, a (merely very schematically) indicated heating device 8 is provided, by means of which a wall 7a of the gas inlet and gas activation element 7 is heated during operation. In the shown embodiment the heating device 8 comprises a (merely symbolically illustrated) power supply 8a, for example with a rectifier, by means of which power supply 8a an electrical current can be guided to the gas inlet and gas activation element 7 via the outer element 5b of the gas and power feed element 4. The electrical current is converted into heat on account of the resistance of the material of the gas inlet and gas activation element 7, whereby the gas inlet and gas activation element 7 is heated. The wall 7a of the gas inlet and gas activation element 7 is preferably heated to a temperature of more than 2000° C. Besides a thermal excitation, an impact excitation of the process gas can thus also be attained. For this purpose, the wall 7a of the gas inlet and gas activation element 7 is preferably made of a material selected from a metal with a high melting point, such as tantalum, molybdenum, tungsten, rhenium, a ceramic material, graphite, pyrolytic carbon, or composite material formed therefrom, or from a preferably fibre-reinforced carbon, without limitation thereto. An electrical insulation 9, for example made of a ceramic material, is also provided between the outer element 5b of the gas and power feed element 4 and a housing of the deposition chamber 3.

As can also be seen from FIG. 1, a further gas inlet element 10, which is vertical in the shown embodiment and through which a further process gas, in particular a carbon-containing process gas, preferably methane, can be introduced into the deposition chamber 3, is arranged on the upper side of the deposition chamber 3. The carbon-containing process gas is thermally excited by flowing over the gas inlet and gas activation element 7, such that the necessary carbon radicals (for example methyl radicals) are produced. Alternatively, the carbon-containing process gas also can be fed through the heated gas inlet and gas activation element 7 jointly with the hydrogen in a defined mixing ratio and thus can be activated. Further process gases, for example nitrogen, oxygen, argon, etc., can also be fed via further gas inlet elements (not shown). The doping of the diamond layer with elements such as boron, phosphorus, nitrogen, sulphur, etc., is also possible in this process—similarly to the prior art.

As can also be seen from FIG. 1, a substrate holder 13 is arranged within the deposition chamber 3 and below the gas inlet and gas activation element 7, with the substrates 2, 2a being arranged on said substrate holder 13. The substrate holder 13 can be cooled via a cooling element 14 (shown merely schematically).

Figure 2:
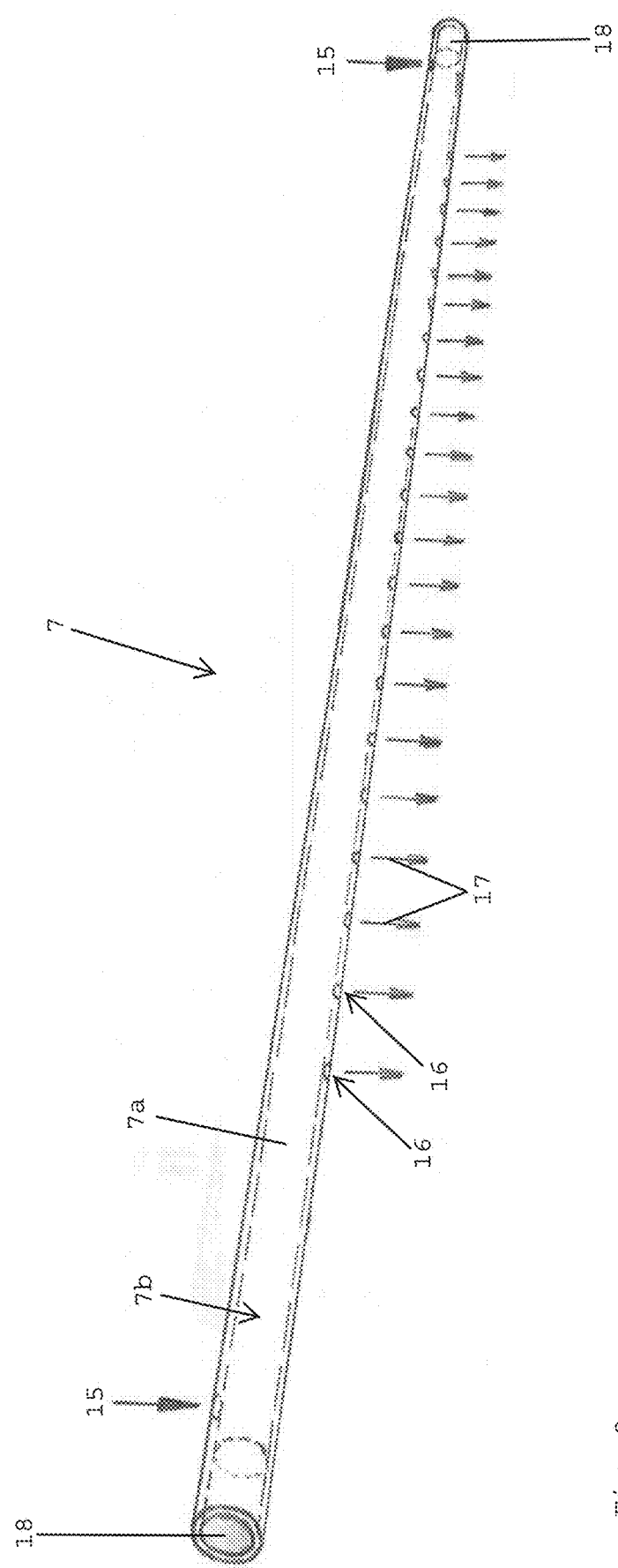
FIG. 2 shows an embodiment of the gas inlet and gas activation element of the device according to FIG. 1.

FIG. 2 shows an embodiment of the gas inlet and gas activation element 7 with a circular cross-sectional area. The gas inlet and gas activation element 7 comprises at least one inlet opening 15 on each of its opposite end regions, through which inlet openings 15 the process gas, in particular hydrogen, is guided into a flow channel 7b of the gas inlet and gas activation element. In addition, the gas inlet and gas activation element 7 comprises a plurality of outlet openings 16 distanced from one another in the longitudinal direction of the gas inlet and gas activation element 7, through which outlet openings 16 the activated, atomic hydrogen is delivered in the direction of the substrate 2 or 2a. The flow direction of the process gas in the direction of the substrates 2 and 2a is illustrated in FIG. 2 by arrows 17. Furthermore, termination bodies 18 for closing off the flow channel 7b at the ends of the gas inlet and gas activation element 7 are shown schematically in FIG. 2.

The ratio of the partial pressure within the gas inlet and gas activation element to the pressure in the deposition chamber is sufficiently high to achieve impact excitation in addition to the thermal activation. A much higher excitation rate of up to 90% is thus achieved. In addition, the average free path length of the activated particles rises to up to several centimetres, whereby the distance from the substrate can be increased, which in turn results in a more uniform diamond layer.

Figure 3:
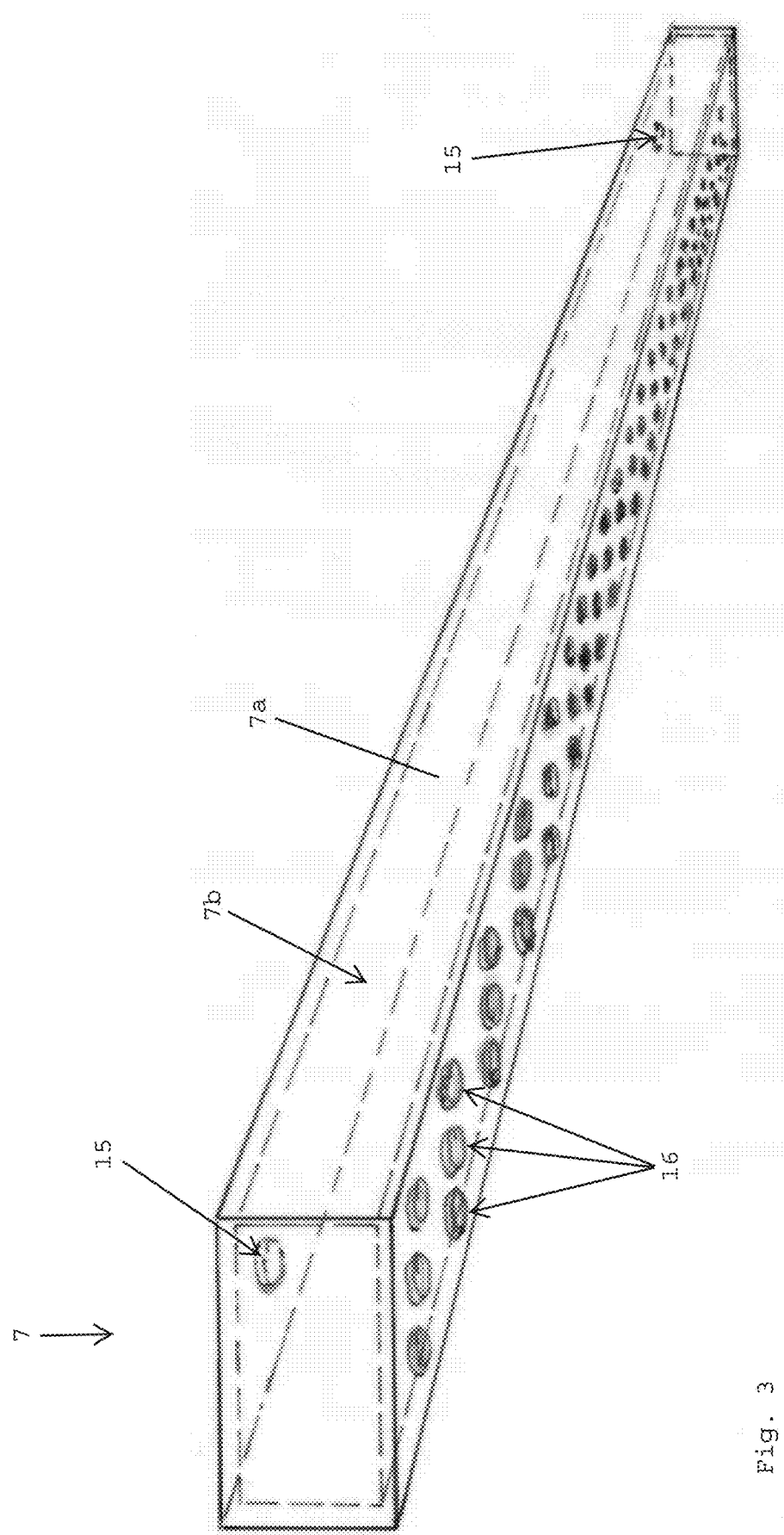
FIG. 3 shows a further embodiment of the gas inlet and gas activation element of the device according to FIG. 1.

FIG. 3 shows an alternative embodiment of the gas inlet and gas activation element 7 with rectangular cross-sectional area. Inlet openings 15 are in turn provided on the upper side of the gas inlet and gas activation element 7, through which inlet openings 15 the process gas, in particular hydrogen (or also a plurality of process gases), is conducted from the gas and power feed element 4 into the gas inlet and gas activation element 7. Outlet openings 16 are arranged on the underside of the gas inlet and gas activation element 7, via which outlet openings 16 the process gas is guided in the direction of the substrates 2 and 2a.

The invention claimed is:

1. A method for applying a carbon layer to a substrate by chemical vapor deposition, said method comprising:
   introducing a process gas into a deposition chamber via a gas inlet and gas activation element, the gas inlet and gas activation element comprising a hollow body having a flow channel for the process gas, a wall surrounding the flow channel, and an outlet opening feeding from the flow channel into the deposition chamber;
   heating the wall of the gas inlet and gas activation element so that the process gas flowing in the flow channel of the gas inlet and gas activation element is excited by impact excitation and thermal excitation; and
   introducing a carbon-containing process gas into the deposition chamber via a further gas inlet element, the further gas inlet element is above the wall surrounding the flow channel and directs the carbon-containing process gas downward and directly to the wall surrounding the flow channel so that the carbon-containing process gas is thermally excited by flowing over the gas inlet and gas activation element, the carbon-containing process gas that is thermally excited flows downwards to the substrate, and
   termination bodies are attached to ends of the gas inlet and gas activation element in order to close off the flow channel.

2. The method according to claim 1, wherein the wall of the gas inlet and gas activation element is heated to a temperature of more than 2000° C.

3. The method of claim 1, wherein said carbon layer is a diamond layer, and said process gas is hydrogen, and said carbon-containing gas is methane.

4. The method of claim 1, wherein the wall of the gas inlet and gas activation element is heated to a temperature of more than 2200° C.

5. A method for applying a carbon layer to a substrate by chemical vapor deposition, said method comprising introducing hydrogen gas into a deposition chamber via a gas-inlet-and-gas-activation-element which has the form of a hollow body;
   heating a wall of the gas-inlet-and-gas-activation-element with a heating device to a temperature of more than 2000° C. so that the hydrogen gas flowing in a flow channel of the gas-inlet-and-gas-activation-element is excited by impact excitation and thermal excitation; and
   wherein one or more outlet openings feeding from the flow channel into the deposition chamber are provided in the wall of the gas-inlet-and-gas-activation-element, wherein the one or more outlet openings are such that a ratio of a partial pressure within the gas-inlet-and-gas-activation-element to a pressure in the deposition chamber is sufficient to excite impact excitation of the hydrogen gas in addition to thermal activation;
   wherein termination bodies are attached to ends of the gas-inlet-and-gas-activation-element in order to close off the flow channel;
   and introducing a further carbon-containing process gas into the deposition chamber via a further gas inlet element, the further gas inlet element is above the wall and directs the carbon-containing process gas downward and directly to the wall so that the further carbon-containing process gas is thermally excited by flowing onto the gas-inlet-and-gas-activation-element, the carbon-containing process gas that is thermally excited flows downwards to the substrate.

6. The method of claim 5, wherein the gas inlet and gas activation element is arranged horizontally in the deposition chamber.

7. The method of claim 5, wherein the at least one outlet opening is arranged on an underside of the gas inlet and gas activation element, the underside facing towards the substrate.

8. The method of claim 5, wherein the gas inlet and gas activation element comprises a number of outlet openings.

9. The method of claim 5, wherein the gas inlet and gas activation element is circular or rectangular in cross-section.

10. The method of claim 5, wherein a plurality of gas inlet and gas activation elements are provided which can be heated by means of the heating device.

11. The method of claim 5, wherein the wall of the gas inlet and gas activation element consists of a metal.

12. The method of claim 5, wherein the heating is to a temperature of more than 2200° C.

13. The method of claim 5, wherein the heating is to a temperature of more than 2400° C.

14. The method of claim 5, wherein the wall of the gas inlet and gas activation element consists tantalum, molybdenum, tungsten, rhenium, a ceramic material, graphite, or pyrolytic carbon or a composite material thereof.

15. The method of claim 5, wherein the wall of the gas inlet and gas activation element comprises fibre-reinforced carbon.

16. The method of claim 5, wherein said carbon containing gas is methane.

17. The method of claim 5, wherein the wall of the gas inlet and gas activation element includes a coating formed from a pyrocarbon.

18. The method of claim 5, wherein said carbon layer is a diamond layer, and said carbon-containing gas is methane.

* * * * *